United States Patent
Fukunaga (10) Patent No.: US 6,546,033 B2
(45) Date of Patent: Apr. 8, 2003

(54) INGAASP SEMICONDUCTOR LASER DEVICE IN WHICH NEAR-EDGE PORTIONS ARE FILLED WITH NON-ABSORBENT LAYER, AND LOWER OPTICAL WAVEGUIDE LAYER INCLUDES INGAP INTERMEDIATE LAYER

(75) Inventor: Toshiaki Fukunaga, Kaisei-machi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/984,852

(22) Filed: Oct. 31, 2001

(65) Prior Publication Data

US 2002/0051477 A1 May 2, 2002

(30) Foreign Application Priority Data

Oct. 31, 2000 (JP) .......................................... 2000/331657

(51) Int. Cl.⁷ ................................................. H01S 5/00
(52) U.S. Cl. .............................. 372/45; 372/46; 372/44; 372/50
(58) Field of Search ............................. 372/44, 45, 46, 372/50

(56) References Cited

U.S. PATENT DOCUMENTS

| | | | |
|---|---|---|---|
| 4,802,182 A | * | 1/1989 | Thornton et al. ............. 372/45 |
| 5,412,678 A | * | 5/1995 | Treat et al. .................... 372/45 |
| 5,960,023 A | * | 9/1999 | Takahashi ..................... 372/45 |
| 6,285,695 B1 | * | 9/2001 | Asano et al. .................. 372/45 |
| 6,424,668 B1 | * | 7/2002 | Murayama .................... 372/45 |

* cited by examiner

Primary Examiner—Paul Ip
Assistant Examiner—Cornelius H Jackson
(74) Attorney, Agent, or Firm—Sughrue Mion, PLLC (57) ABSTRACT

In a process for producing a semiconductor laser device, an n-type cladding layer, an n-type or i-type $In_{x2}Ga_{1-x2}As_{1-y2}P_{y2}$ first lower optical waveguide layer, an i-type $In_{x5}Ga_{1-x5}P$ intermediate layer, an i-type $In_{x2}Ga_{1-x2}As_{1-y2}P_{y2}$ second lower optical waveguide layer, an $In_{x1}Ga_{1-x1}As_{1-y1}P_{y1}$ compressive strain active layer, a p-type or i-type $In_{x2}Ga_{1-x2}As_{1-y2}P_{y2}$ first upper optical waveguide layer, and an $In_{x5}Ga_{1-x5}P$ cap layer are formed on an n-type GaAs substrate. Then, near-edge portions of the cap layer are etched off with a hydrochloric acid etchant, and near-edge portions of the active region above the intermediate layer are etched off with a sulfuric acid etchant so as to produce spaces in vicinities of end facets. Next, the spaces are filled with a p-type $In_{x2}Ga_{1-x2}As_{1-y2}P_{y2}$ second upper optical waveguide layer formed over the cap layer, and a p-type upper cladding layer is formed on the second upper optical waveguide layer.

7 Claims, 5 Drawing Sheets

FIG. 1A

A-A' CROSS SECTION

FIG. 1B

B-B' CROSS SECTION

A-A' CROSS SECTION

B-B' CROSS SECTION

FIG. 3B — A-A' CROSS SECTION

FIG. 3C — B-B' CROSS SECTION

A-A' CROSS SECTION

B-B' CROSS SECTION

FIG. 5A

A-A' CROSS SECTION

FIG. 5B

B-B' CROSS SECTION

FIG. 5C

INGAASP SEMICONDUCTOR LASER DEVICE IN WHICH NEAR-EDGE PORTIONS ARE FILLED WITH NON-ABSORBENT LAYER, AND LOWER OPTICAL WAVEGUIDE LAYER INCLUDES INGAP INTERMEDIATE LAYER

BACKGROUND OF THE INVENTION

1. Field of the Invention

The present invention relates to a semiconductor laser device having an end-facet window structure, and a process for producing such a semiconductor laser device.

2. Description of the Related Art

In conventional semiconductor laser devices, when optical output power is increased, currents generated by optical absorption in vicinities of end facets generate heat, i.e., raise the temperature at the end facets. In addition, the raised temperature reduces the semiconductor bandgaps at the end facets, and therefore the optical absorption is further enhanced. That is, a vicious cycle is formed, and the end facets are damaged. This damage is the so-called catastrophic optical mirror damage (COMD). Thus, the maximum optical output power is limited due to the COMD. In addition, when the optical power reaches the COMD level, the optical output deteriorates with time. Further, the semiconductor laser device is likely to suddenly break down due to the COMD. It is known that high reliability in high output power operation can be achieved when window structures are formed in the vicinities of end facets, i.e., crystals having a greater bandgap than an active layer are formed in the vicinities of the end facets, so as to prevent the light absorption in the vicinities of end facets.

For example, Kazushige Kawasaki et al. ("0.98 $\mu$m band ridge-type window structure semiconductor laser (1)," Digest 29a-PA-19, 1997 Spring JSAP Annual Meeting, The Japan Society of Applied Physics) disclose a semiconductor laser device in the 980 nm band, which has a window structure formed by injecting Si ions into end regions of a ridge structure and disordering an $In_{0.2}Ga_{0.8}As$ quantum well by thermal diffusion. However, the process for producing the above semiconductor laser device is very complicated and long since the vicinities of end facets are required to be insulated by injection of H ions after the injection of the Si ions in the vicinity of the active layer in order to prevent a current flow in the vicinities of end facets.

In addition, when the active layer contains aluminum, the reliability of the semiconductor laser device is decreased due to oxidation of aluminum. In particular, when a window structure is formed by removing near-edge portions of the active layer and regrowing semiconductor layers in the near-edge portions, aluminum is exposed on the regrowth boundary. Therefore, the reliability of the semiconductor laser device is further decreased.

SUMMARY OF THE INVENTION

An object of the present invention is to provide a semiconductor laser device which does not contain aluminum in an active layer, has a window structure being non-absorbent of light in vicinities of end facets, and is reliable in a wide output power range from low to high output power.

Another object of the present invention is to provide a process which can produce, by a simple process, a semiconductor laser device which does not contain aluminum in an active layer, has a window structure being non-absorbent of light in vicinities of end facets, and is reliable in a wide output power range from low to high output power.

(1) According to the first aspect of the present invention, there is provided a semiconductor laser device comprising: a GaAs substrate of a first conductive type; a lower cladding layer of the first conductive type, formed on the GaAs substrate; a first lower optical waveguide layer made of $In_{x2}Ga_{1-x2}As_{1-y2}P_{y2}$ having a first bandgap, and formed on the lower cladding layer, where $0 \leq x2 \leq 0.3$ and $x2=0.49y2$; an intermediate layer made of $In_{x5}Ga_{1-x5}P$ and formed on the first lower optical waveguide layer, where $0<x5<1$; a second lower optical waveguide layer made of $In_{x2}Ga_{1-x2}As_{1-y2}P_{y2}$ having the first bandgap, and formed on the intermediate layer except for near-edge areas of the first intermediate layer located in first vicinities of opposite end facets of the semiconductor laser device so as to leave first portions of spaces in the first vicinities of opposite end facets, where $0 \leq x2 \leq 0.3$ and $x2=0.49y2$; a compressive strain active layer made of $In_{x1}Ga_{1-x1}As_{1-y1}P_{y1}$ having a second bandgap smaller than the first bandgap, and formed on the second lower optical waveguide layer so as to leave second portions of the spaces in second vicinities of opposite end facets, where $0<x1 \leq 0.4$ and $0 \leq y1 \leq 0.1$; an upper optical waveguide layer made of $In_{x2}Ga_{1-x2}As_{1-y2}P_{y2}$ having the first bandgap, and formed on the compressive strain active layer so as to leave third portions of the spaces in third vicinities of opposite end facets, where $0 \leq x2 \leq 0.3$ and $x2=0.49y2$; a cap layer made of $In_{x5}Ga_{1-x5}P$ and formed on the upper optical waveguide layer so as to leave fourth portions of the spaces in fourth vicinities of opposite end facets, where $0<x5<1$; a non-absorbent layer made of $In_{x6}Ga_{1-x6}As_{1-y6}P_{y6}$ having a third bandgap greater than the second bandgap, and formed over the cap layer so that the spaces are filled with the non-absorbent layer, where $0 \leq x6 \leq 0.3$ and $x6=0.49y6$; an upper cladding layer of a second conductive type, formed on the non-absorbent layer; and a contact layer of the second conductive type, formed on the upper cladding layer.

In addition, each of the lower and upper cladding layers, the first and second lower optical waveguide layers, the upper optical waveguide layer, and the non-absorbent layer are assumed to have such a composition as to lattice-match with the active layer.

In this specification, the lattice matching is defined as follows.

When c1 and c2 are lattice constants of first and second layers, respectively, and the absolute value of the amount $(c_1-c_2)/c_2$ is equal to or smaller than 0.001, the first layer is lattice-matched with the second layer. For example, when cs and c are the lattice constants of a substrate and a layer grown above the substrate, respectively, and the absolute value of the amount $(c-c_s)/c_s$ is equal to or smaller than 0.001, the layer grown above the substrate is lattice-matched with the substrate.

Further, the first conductive type is different in polarity of carriers from the second conductive type. That is, when the first conductive type is p type, and the second conductive type is n type.

Preferably, the semiconductor laser device according to the first aspect of the present invention may also have one or any possible combination of the following additional features (i) to (v).

(i) The contact layer may be formed on the upper cladding layer except for near-edge areas of the upper cladding layer located in fifth vicinities of the end facets of the semiconductor laser device, and an insulation layer may be formed on the near-edge areas of the upper cladding layer so as to prevent current injection through the near-edge areas of the upper cladding layer.

(ii) Each of the lower and upper cladding layers may be made of one of $Al_{z1}Ga_{1-z1}As$ and $In_{x3}(Al_{z3}Ga_{1-z3})_{1_{31\ x3}}As_{1-y3}P_{y3}$, where $0.2 \leq z1 \leq 0.8$, $x3=0.49y3$, $0.9<y3 \leq 1$, and $0 \leq z3 \leq 1$.

(iii) Regions of the semiconductor laser device above at least a mid-thickness of the upper cladding layer except for a stripe region of the semiconductor laser device may be removed so as to form a ridge and realize index guidance of light.

(iv) The semiconductor laser device according to the first aspect of the present invention may further comprise a current confinement layer made of one of $Al_{z2}Ga_{1-z2}As$ and $In_{0.49}Ga_{0.51}P$ which lattice-match with GaAs, and formed above the upper optical waveguide layer so as to form an internal current confinement structure realizing index guidance of light, where $0.2<z2<1$.

(v) In order to compensate for the strain of the active layer, two $In_{x4}Ga_{1-x4}As_{1-y4}P_{y4}$ tensile strain barrier layers ($0 \leq x4<0.49y4$, $0<y4 \leq 1$) may be formed in vicinities of the active layer.

The strain $\Delta a$ of the active layer and the strain $\Delta b$ of the $In_{x4}Ga_{1-x4}As_{1-y4}P_{y4}$ tensile strain barrier layers can be expressed by $$\Delta a=(c_a-c_s)/c_s,$$

and $$\Delta b=(c_b-c_s)/c_s$$

where $c_a$, $c_b$, and cs are lattice constants of the active layer, the $In_{x4}Ga_{1-x4}As_{1-y4}P_{y4}$ tensile strain barrier layers, and the GaAs substrate, respectively.

In this case, in order to prevent damage to the crystals in the active region, it is preferable that the active layer and the tensile strain barrier layers satisfy the following inequalities, $$-0.25\ nm \leq \Delta a \times da + 2\Delta b \times db \leq 0.25\ nm,$$

where da and db are respectively the thicknesses of the active layer and each of the tensile strain barrier layers.

(2) According to the second aspect of the present invention, there is provided a process for producing a semiconductor light emitting device, comprising the steps of: (a) forming above a GaAs substrate of a first conductive type a lower cladding layer of the first conductive type; (b) forming above the lower cladding layer a first lower optical waveguide layer made of $In_{x2}Ga_{1-x2}As_{1-y2}P_{y2}$, where $0 \leq x2 \leq 0.3$ and $x2=0.49y2$; (c) forming above the first lower optical waveguide layer an intermediate layer made of $In_{x5}Ga_{1-x5}P$, where $0<x5<1$; (d) forming above the intermediate layer a second lower optical waveguide layer made of $In_{x2}Ga_{1-x2}As_{1-y2}P_{y2}$, where $0 \leq x2 \leq 0.3$ and $x2=0.49y2$; (e) forming above the second lower optical waveguide layer a compressive strain active layer made of $In_{x1}Ga_{1-x1}As_{1-y1}P_{y1}$, where $0<x1 \leq 0.4$ and $0 \leq y1 \leq 0.1$; (f) forming above the compressive strain active layer a first upper optical waveguide layer made of $In_{x2}Ga_{1-x2}As_{1-y2}P_{y2}$ where $0 \leq x2 \leq 0.3$ and $x2=0.49y2$; (g) forming above the first upper optical waveguide layer a first cap layer made of $In_{x5}Ga_{1-x5}P$, where $0<x5<1$; (h) etching off near-edge portions of the first cap layer located in first vicinities of two opposite end facets of the semiconductor laser device with a hydrochloric acid etchant so as to produce first portions of spaces in the first vicinities of the two opposite end to facets of the semiconductor laser device; (i) etching off near-edge portions of the upper optical waveguide layer, the compressive strain active layer, and the second lower optical waveguide layer, located in second vicinities of the two opposite end facets of the semiconductor laser device, by using a sulfuric acid etchant and the first cap layer as a mask, so as to produce second portions of the spaces in second vicinities of two opposite end facets of the semiconductor laser device; (j) forming a second upper optical waveguide layer made of $In_{x2}Ga_{1-x2}As_{1-y2}P_{y2}$ over the first cap layer so that the spaces are filled with the second upper optical waveguide layer, where $0 \leq x2 \leq 0.3$ and $x2=0.49y2$; (k) forming an upper cladding layer of a second conductive type over the second upper optical waveguide layer; and (l) forming a GaAs contact layer of the second conductive type above the upper cladding layer.

In addition, each of the lower and upper cladding layers, the first and second lower optical waveguide layers, the upper optical waveguide layer, and the non-absorbent layer are assumed to have such a composition as to lattice-match with the active layer.

The process according to the second aspect of the present invention may further comprise, between the steps (g) and (h), the steps of (m) forming a second cap layer made of GaAs, on the first cap layer; and (n) etching off near-edge portions of the second cap layer located in third vicinities of the two opposite end facets of the semiconductor laser device by using a sulfuric acid etchant so as to produce additional portions of the spaces. In this case, in the step (h), the second cap layer is used as a mask; and in the step (i), the second cap layer is etched off concurrently with the near-edge portions of the upper optical waveguide layer, the compressive strain active layer, and the second lower optical waveguide layer.

(3) The present invention has the following advantages.

(a) According to the present invention, the compressive strain active layer is made of $In_{x1}Ga_{1-x1}As_{1-y1}P_{y1}$, the first and second lower optical waveguide layers and the upper optical waveguide layer are made of $In_{x2}Ga_{1-x2}As_{1-y2}P_{y2}$, and the intermediate layer made of $In_{x5}Ga_{1-x5}P$ is formed between the first and second lower optical waveguide layers, where $0<x1 \leq 0.4$, $0 \leq y1 \leq 0.1$, $0 \leq x2 \leq 0.3$ and $x2=0.49y2$. Therefore, when the upper optical waveguide layer, the active layer, and the second lower optical waveguide layer are etched with a sulfuric acid etchant, the etching automatically stops at the upper surface of the $In_{x5}Ga_{1-x5}P$ intermediate layer. Thus, the depth of the etching with the sulfuric acid etchant can be easily controlled, and the spaces in the vicinities of the end facets can be accurately produced by a simple process for realizing the end-facet window structure.

In addition, the end-facet window structure is realized by filling the accurately produced spaces with the $In_{x2}Ga_{1-x2}As_{1-y2}P_{y2}$ non-absorbent layer having a higher bandgap than the active layer. Therefore, it is possible to produce a reliable semiconductor laser device.

(b) The $In_{x5}Ga_{1-x5}P$ cap layer is formed above the upper optical waveguide layer. Therefore, the regrowth of the InGaAsP layer after the production of the spaces in the vicinities of the end facets becomes easy when the intermediate-stage structure after the production of the spaces in the vicinities of the end facets is placed in a phosphorus atmosphere.

In addition, an InGaAsP layer having a greater bandgap than that of the active layer is embedded in the vicinities of the end facets. That is, window structures which are non-absorbent of the oscillation light can be stably formed in the vicinities of the end facets. Therefore, it is possible to achieve high reliability in a wide output power range from low to high output power.

Further, since the depth of the spaces produced by the etching in the vicinities of the end facets is small, the upper surface of the regrown $In_{x2}Ga_{1-x2}As_{1-y2}P_{y2}$ non-absorbent layer easily becomes flattened, and therefore the index-guided structure can be easily formed through the entire length of the semiconductor laser device.

(c) The near-edge portions of the active layer are removed, and the spaces produced by the removal are filled with the non-absorbent layer by the regrowth. Therefore, it is possible to prevent current generation by light absorption in the vicinities of the end facets, and reduce heat generation in the vicinities of the end facets. Thus, the COMD level is greatly raised. That is, the semiconductor laser device according to the present invention is reliable even in operation with high output power.

In addition, when the semiconductor laser device has the aforementioned additional feature (i), the contact layer is not formed on the near-edge areas of the upper cladding layer. Therefore, the current for driving the semiconductor laser device is not injected into the near-edge portions of the semiconductor laser device. Thus, the heat generation in the vicinities of the end facets can be further reduced.

(d) The InGaP layer, which has a greater bandgap than InGaAsP, is formed between the first and second lower optical waveguide layers. Therefore, it is possible to prevent leakage of carriers from the active layer. Thus, the threshold current can be further lowered.

(e) Since the active layer does not contain aluminum, aluminum is not exposed on the regrowth boundary. Therefore, degradation caused by oxidation can be prevented. Thus, it is possible to produce a highly reliable semiconductor laser device.

DESCRIPTION OF PREFERRED EMBODIMENTS

Embodiments of the present invention are explained in detail below with reference to drawings.

First Embodiment

Figure 1A:
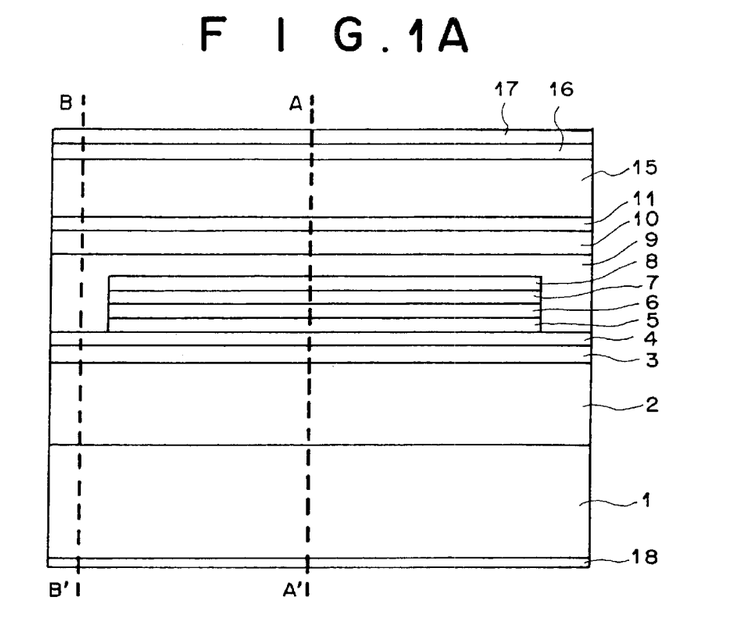
FIGS. 1A to 1C are cross-sectional views of a semiconductor laser device as a first embodiment of the present invention.
Figures 1B, 1C:
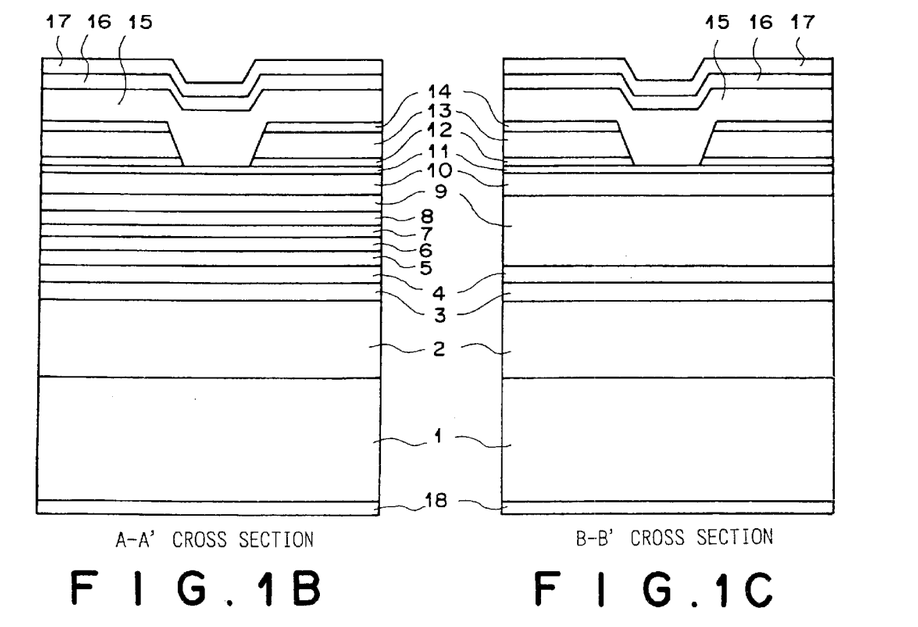

A process for producing a semiconductor laser device as the first embodiment of the present invention is explained below. FIGS. 1A to 1C are cross-sectional views of a semiconductor laser device as the first embodiment of the present invention. FIG. 1A shows a cross section parallel to the direction of light emitted from the semiconductor laser device, and FIGS. 1B and 1C respectively show the A–A' and B–B' cross sections indicated in FIG. 1A. Although, in practice, a plurality of semiconductor laser devices are concurrently manufactured on a semiconductor wafer of a substrate, and arranged side by side, a construction corresponding to only one semiconductor laser device is indicated in each of FIGS. 1A to 1C for the sake of simplicity of illustration and better understanding.

First, as illustrated in FIG. 1A, an n-type $Al_{z1}Ga_{1-z1}As$ lower cladding layer 2, an n-type or i-type (intrinsic) $In_{x2}Ga_{1-x2}As_{1-y2}P_{y2}$ first lower optical waveguide layer 3 ($0 \leq x2 \leq 0.3$, $x2=0.49y2$), an i-type $In_{0.49}Ga_{0.51}P$ lower etching stop layer 4 having a thickness of about 5 nm, an i-type $In_{x2}Ga_{1-x2}As_{1-y2}P_{y2}$ second lower optical waveguide layer 5 having a thickness of about 10 nm, an $In_{x1}Ga_{1-x1}As_{1-y1}P_{y1}$ compressive strain quantum well active layer 6 ($0<x1<0.4$, $0 \leq y1 \leq 0.1$), a p-type or i-type $In_{x2}Ga_{1-x2}As_{1-y2}P_{y2}$ first upper optical waveguide layer 7 having a thickness of about 10 nm, and an $In_{0.49}Ga_{0.51}P$ cap layer 8 having a thickness of about 5 nm are formed on an n-type GaAs substrate 1 (in the form of a semiconductor wafer) by organometallic vapor phase epitaxy.

Next, a resist is applied to the $In_{0.49}Ga_{0.51}P$ cap layer 8, and predetermined stripe regions of the resist each having a width of about 40 micrometers and extending in the <0$\bar{1}$1> direction are removed by conventional lithography, where the locations of the stripe regions are determined so that the center of each of the stripe regions correspond to resonator surfaces of the plurality of semiconductor laser devices produced from the semiconductor wafer.

Thereafter, the $In_{0.49}Ga_{0.51}P$ cap layer 8 is etched with a hydrochloric acid etchant by using the remaining portions of the resist as a mask so that stripe areas of the $In_{x2}Ga_{1-x2}As_{1-y2}P_{y2}$ first upper optical waveguide layer 7 are exposed (i.e., first stripe grooves are formed). At this time, the etching with the hydrochloric acid etchant automatically stops at the upper surface of the $In_{x2}Ga_{1-x2}As_{1-y2}P_{y2}$ first upper optical waveguide layer 7. Then, the remaining portions of the resist are removed, and the layered structure is etched with a sulfuric acid etchant until stripe areas of the $In_{0.49}Ga_{0.51}P$ lower etching stop layer 4 are exposed. At this time, the etching with the sulfuric acid etchant automatically stops at the upper surface of the $In_{0.49}Ga_{0.51}P$ lower etching stop layer 4.

Next, a p-type or i-type $In_{x2}Ga_{1-x2}As_{1-y2}P_{y2}$ second upper optical waveguide layer 9, a p-type $Al_{z1}Ga_{1-z1}As$ first upper cladding layer 10, and a p-type GaAs first upper etching stop layer 11 having a thickness of about 10 nm are formed. Subsequently, as illustrated in FIG. 1B, an $In_{0.49}Ga_{0.51}P$ second upper etching stop layer 12 having a thickness of about 10 nm, an n-type $Al_{z2}Ga_{1-z2}As$ current confinement layer 13 ($z2>z1$), and a GaAs cap layer 14 are formed.

Thereafter, a resist is applied to the GaAs cap layer 14, and predetermined stripe regions of the resist each having a width of about 1 to 3 micrometers and extending in the <011> direction (i.e., perpendicular to the above first stripe grooves) are removed. Then, the GaAs cap layer 14 and the n-type $Al_{z2}Ga_{1-z2}As$ current confinement layer 13 are etched with a sulfuric acid etchant by using the remaining portions of the resist as a mask so that stripe areas of the $In_{0.49}Ga_{0.51}P$ second upper etching stop layer 12 are exposed (i.e., second stripe grooves are formed). At this time, the etching with the sulfuric acid etchant automatically stops at the upper surface of the $In_{0.49}Ga_{0.51}P$ second upper etching stop layer 12. Subsequently, the remaining portions of the resist are removed, and the stripe areas of the $In_{0.49}Ga_{0.51}P$ second upper etching stop layer 12 are removed by etching with a hydrochloric acid etchant.

Next, a p-type $Al_{z1}Ga_{1-z1}As$ second upper cladding layer 15 and a p-type GaAs contact layer 16 are formed. Then, a p electrode 17 is formed over the p-type GaAs contact layer 16, the exposed (opposite) surface of the substrate 1 is polished, and an n electrode 18 is formed on the polished surface of the substrate 1.

After the above layered structure is formed on the semiconductor wafer, the semiconductor wafer with the layered structure is cleaved at the positions of the end facets into laser array bars. Then, high-reflection coating and low-reflection coating are laid on the end facets of the laser array bars. Thereafter, the laser array bars are further cleaved into chips. Thus, the semiconductor laser device as the first embodiment of the present invention is obtained.

In the above construction, the p-type $Al_{z1}Ga_{1-z1}As$ first upper cladding layer 10 is arranged to have such a thickness that oscillation in a fundamental transverse mode can be maintained even when the semiconductor laser device operates with high output power. That is, a difference in an equivalent refractive index between a portion of the active region under the second stripe groove and another portion of the active region which is not located under the second stripe groove is in a range from $1.5 \times 10^{-3}$ to $7 \times 10^{-3}$.

In addition, the n-type $Al_{z1}Ga_{1-z1}As$ lower cladding layer 2, the p-type $Al_{z1}Ga_{1-z1}As$ first upper cladding layer 10, and the p-type $Al_{z1}Ga_{1-z1}As$ second upper cladding layer 15 have such a composition as to have a greater bandgap than the n-type or i-type $In_{x2}Ga_{1-x2}As_{1-y2}P_{y2}$ first lower optical waveguide layer 3, the $In_{x2}Ga_{1-x2}As_{1-y2}P_{y2}$ first upper optical waveguide layer 7, and the p-type or i-type $In_{x2}Ga_{1-x2}As_{1-y2}P_{y2}$ second upper optical waveguide layer 9 have. For example, the n-type $Al_{z1}Ga_{1-z1}As$ lower cladding layer 2, the p-type $Al_{z1}Ga_{1-z1}As$ first upper cladding layer 10, and the p-type $Al_{z1}Ga_{1-z1}As$ second upper cladding layer 15 may be made of an InGaAlP or InGaAlAsP material which lattice-matches with the GaAs substrate 1.

As illustrated in FIGS. 1B and 1C, in the near-edge portions (i.e., portions in vicinities of the end facets) of the layered structure, the thickness from the upper surface of the $In_{0.49}Ga_{0.51}P$ cap layer 8 to the bottom of the i-type $In_{x2}Ga_{1-x2}As_{1-y2}P_{y2}$ second lower optical waveguide layer 5 is removed, and the spaces produced by the removal are filled with the p-type or i-type $In_{x2}Ga_{1-x2}As_{1-y2}P_{y2}$ second upper optical waveguide layer 9.

Alternatively, in the process described above, the near-edge portions (i.e., portions in vicinities of the end facets) of the layered structure may be removed as follows.

A GaAs cap layer having a thickness of about 10 nm is formed on the $In_{0.49}Ga_{0.51}P$ cap layer 8, and a resist is applied to the GaAs cap layer. Then, predetermined stripe regions of the resist each having a width of about 40 micrometers and extending in the <0$\bar{1}$1> direction are removed by conventional lithography, where the locations of the stripe regions are determined so that the center of each of the stripe regions correspond to resonator surfaces of the plurality of semiconductor laser devices produced from the semiconductor wafer.

Thereafter, the GaAs cap layer is etched with a sulfuric acid etchant by using the remaining portions of the resist as a mask so that stripe areas of the $In_{0.49}Ga_{0.51}P$ cap layer 8 are exposed. Then, the remaining portions of the resist are removed, and the $In_{0.49}Ga_{0.51}P$ cap layer 8 is etched with a hydrochloric acid etchant by using the remaining portions of the GaAs cap layer as a mask so that stripe areas of the $In_{x2}Ga_{1-x2}As_{1-y2}P_{y2}$ first upper optical waveguide layer 7 are exposed. Subsequently, the layered structure is etched with a sulfuric acid etchant so that the remaining portions of the GaAs cap layer are removed, and stripe areas of the $In_{0.49}Ga_{0.51}P$ lower etching stop layer 4 are exposed. In the case where the GaAs cap layer is formed on the $In_{0.49}Ga_{0.51}P$ cap layer 8, it is possible to prevent deposition of organic substances or the like on a regrowth surface during the process for removing the near-edge portions.

Second Embodiment

Figure 2A:
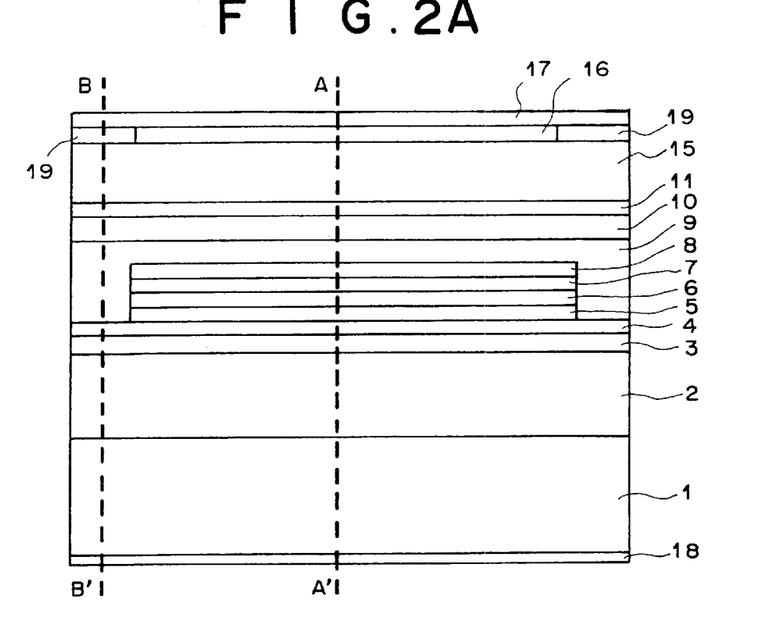
FIGS. 2A to 2C are cross-sectional views of a semiconductor laser device as a second embodiment of the present invention.
Figure 2B:
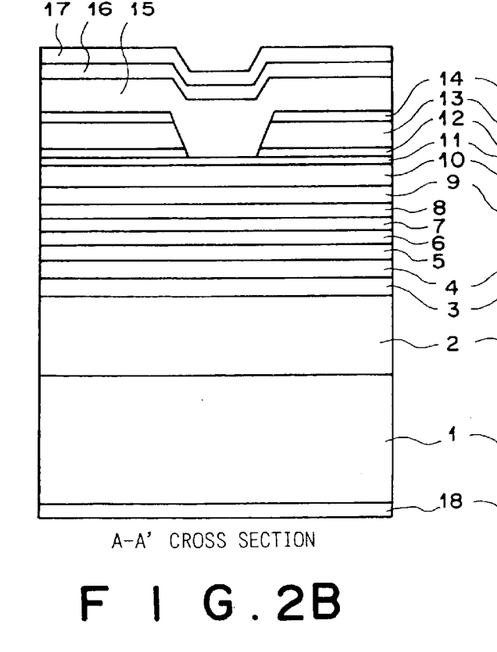
Figure 2C:
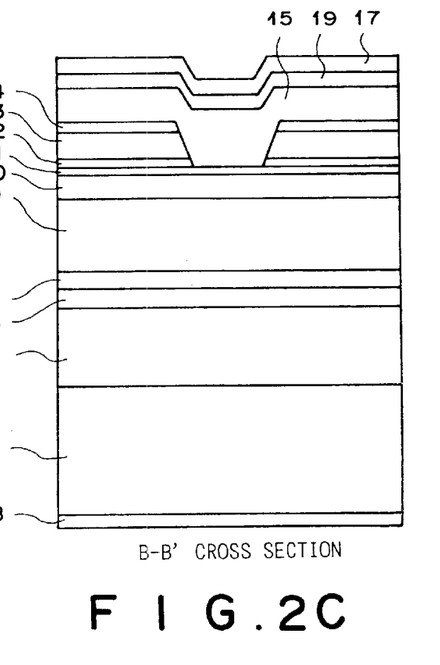

FIGS. 2A to 2C are cross-sectional views of a semiconductor laser device as a second embodiment of the present invention. FIG. 2A shows a cross section parallel to the direction of light emitted from the semiconductor laser device, and FIGS. 2B and 2C respectively show the A–A' and B–B' cross sections indicated in FIG. 2A. Although, in practice, a plurality of semiconductor laser devices are concurrently manufactured on a semiconductor wafer of a substrate, and arranged side by side, a construction corresponding to only one semiconductor laser device is indicated in each of FIGS. 2A to 2C for the sake of simplicity of illustration and better understanding.

The semiconductor laser device as the second embodiment of the present invention is different from the semiconductor laser device as the first embodiment of the present invention in only the formation of the contact layer as described below. Therefore, explanations of the same features as the first embodiment are not repeated.

That is, in the second embodiment, after the p-type GaAs contact layer 16 is formed, stripe regions of the p-type GaAs contact layer 16 located above the aforementioned near-edge portions are removed, and the removed regions are covered with an insulation film 19. Subsequently, the p 25 electrode 17 is formed over the remaining areas of the p-type GaAs contact layer 16 and the insulation film 19. Thereafter, the exposed (opposite) surface of the substrate 1 is polished, and the n electrode 18 is formed on the polished surface of the substrate 1.

In the semiconductor laser device as the second embodiment of the present invention, the current injected into the window structure can be greatly reduced. Therefore, the optical output power can be further increased.

Third Embodiment

Figure 3A:
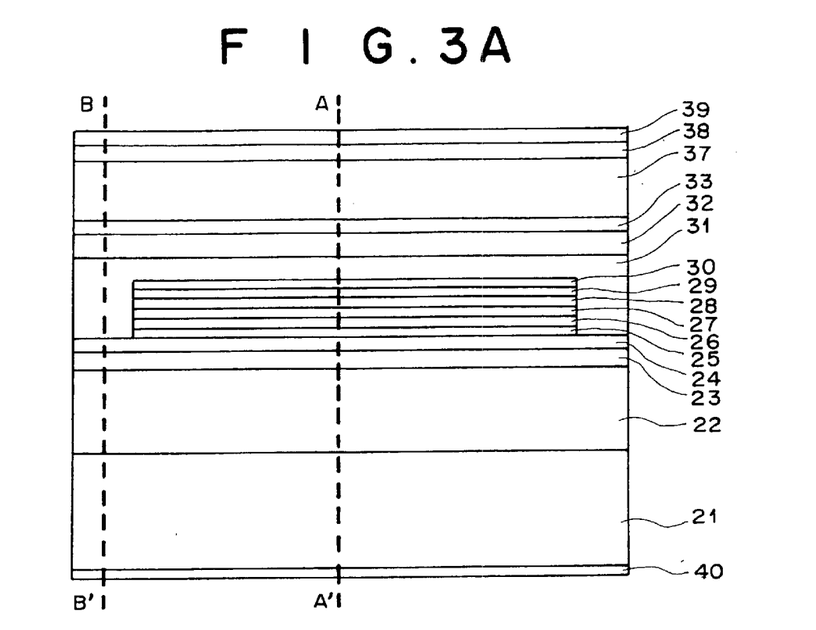
FIGS. 3A to 3C are cross-sectional views of a semiconductor laser device as a third embodiment of the present invention.
Figure 3B:
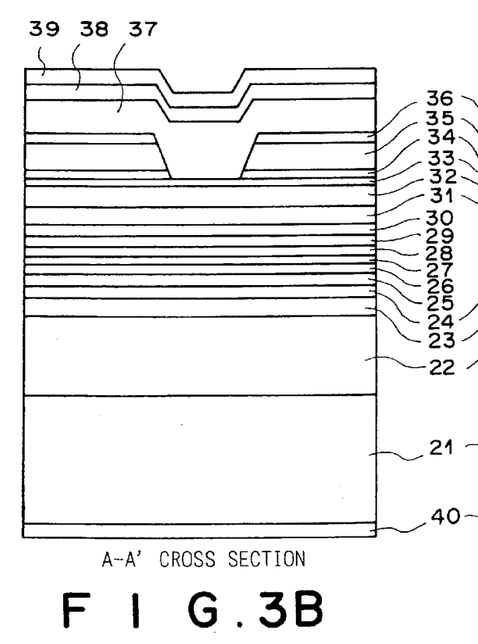
Figure 3C:
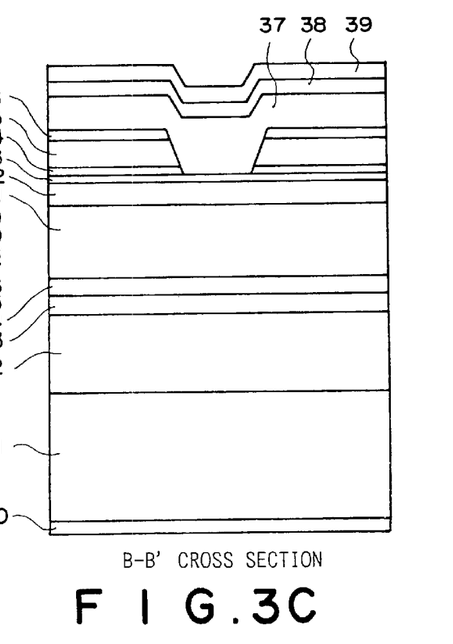

A process for producing a semiconductor laser device as the third embodiment of the present invention is explained below. FIGS. 3A to 3C are cross-sectional views of a semiconductor laser device as the third embodiment of the present invention. FIG. 3A shows a cross section parallel to the direction of light emitted from the semiconductor laser device, and FIGS. 3B and 3C respectively show the A–A' and B–B' cross sections indicated in FIG. 3A. Although, in practice, a plurality of semiconductor laser devices are concurrently manufactured on a semiconductor wafer of a substrate, and arranged side by side, a construction corresponding to only one semiconductor laser device is indicated in each of FIGS. 3A to 3C for the sake of simplicity of illustration and better understanding.

First, as illustrated in FIG. 3A, an n-type $Al_{z1}Ga_{1-z1}As$ lower cladding layer 22, an n-type or i-type (intrinsic) $In_{x2}Ga_{1-x2}As_{1-y2}P_{y2}$ first lower optical waveguide layer 23 ($0 \leq x2 \leq 0.3$, $x2=0.49y2$), an i-type $In_{0.49}Ga_{0.51}P$ lower etching stop layer 24 having a thickness of about 5 nm, an i-type $In_{x2}Ga_{1-x2}As_{1-y2}P_{y2}$ second lower optical waveguide layer 25 having a thickness of about 10 nm, an $In_{x4}Ga_{1-x4}As_{1-y4}P_{y4}$ tensile strain barrier layer 26 ($0<x4<0.49y4$, $0<y4\leq 1$), an $In_{x1}Ga_{1-x1}As_{1-y1}P_{y1}$ compressive strain quantum well active layer 27 ($0<x1\leq 0.4$, $0\leq y1\leq 0.1$), an $In_{x4}Ga_{1-x4}As_{1-y4}P_{y4}$ tensile strain barrier layer 28, an i-type $In_{x2}Ga_{1-x2}As_{1-y2}P_{y2}$ first upper optical waveguide layer 29 having a thickness of about 10 nm, and an $In_{0.49}Ga_{0.51}P$ cap layer 30 having a thickness of about 5 nm are formed on an n-type GaAs substrate 21 (in the form of a semiconductor wafer) by organometallic vapor phase epitaxy.

Next, a resist is applied to the $In_{0.49}Ga_{0.51}P$ cap layer 30, and predetermined stripe regions of the resist each having a width of about 40 micrometers and extending in the <0$\bar{1}$1> direction are removed by conventional lithography, where the locations of the stripe regions are determined so that the center of each of the stripe regions correspond to resonator surfaces of the plurality of semiconductor laser devices produced from the semiconductor wafer.

Thereafter, the $In_{0.49}Ga_{0.51}P$ cap layer 30 is etched with a hydrochloric acid etchant by using the remaining portions of the resist as a mask so that stripe areas of the $In_{x2}Ga_{1-x2}As_{1-y2}P_{y2}$ first upper optical waveguide layer 29 are exposed (i.e., first stripe grooves are formed). At this time, the etching with the hydrochloric acid etchant automatically stops at the upper surface of the $In_{x2}Ga_{1-x2}As_{1-y2}P_{y2}$ first upper optical waveguide layer 29. Then, the remaining portions of the resist are removed, and the layered structure is etched with a sulfuric acid etchant until stripe areas of the $In_{0.49}Ga_{0.51}P$ lower etching stop layer 24 are exposed. At this time, the etching with the sulfuric acid etchant automatically stops at the upper surface of the $In_{0.49}Ga_{0.51}P$ lower etching stop layer 24.

Next, a p-type or i-type $In_{x2}Ga_{1-x2}As_{1-y2}P_{y2}$ second upper optical waveguide layer 31, a p-type $Al_{z1}Ga_{1-z1}As$ first upper cladding layer 32, and a p-type GaAs first upper etching stop layer 33 having a thickness of about 10 nm are formed. Subsequently, as illustrated in FIG. 3B, an $In_{0.49}Ga_{0.51}P$ second upper etching stop layer 34 having a thickness of about 10 nm, an n-type $Al_{z2}Ga_{1-z2}As$ current confinement layer 35 ($z2>z1$), and a GaAs cap layer 36 are formed.

Thereafter, a resist is applied to the GaAs cap layer 36, and predetermined stripe regions of the resist each having a width of about 1 to 3 micrometers and extending in the <011> direction (i.e., perpendicular to the above first stripe grooves) are removed. Then, the GaAs cap layer 36 and the n-type $Al_{z2}Ga_{1-z2}As$ current confinement layer 35 are etched with a sulfuric acid etchant by using the remaining portions of the resist as a mask so that stripe areas of the $In_{0.49}Ga_{0.51}P$ second upper etching stop layer 34 are exposed (i.e., second stripe grooves are formed). At this time, the etching with the sulfuric acid etchant automatically stops at the upper surface of the $In_{0.49}Ga_{0.51}P$ second upper etching stop layer 34. Subsequently, the remaining portions of the resist are removed, and the stripe areas of the $In_{0.49}Ga_{0.51}P$ second upper etching stop layer 34 are removed by etching with a hydrochloric acid etchant.

Next, a p-type $Al_{z1}Ga_{1-z1}As$ second upper cladding layer 37 and a p-type GaAs contact layer 38 are formed. Then, a p electrode 39 is formed over the p-type GaAs contact layer 38, the exposed (opposite) surface of the substrate 21 is polished, and an n electrode 40 is formed on the polished surface of the substrate 21.

After the above layered structure is formed on the semiconductor wafer, the semiconductor wafer with the layered structure is cleaved at the positions of the end facets into laser array bars. Then, high-reflection coating and low-reflection coating are laid on the end facets of the laser array bars. Thereafter, the laser array bars are further cleaved into chips. Thus, the semiconductor laser device as the third embodiment of the present invention is obtained.

In the above construction, the p-type $Al_{z1}Ga_{1-z1}As$ first upper cladding layer 32 is arranged to have such a thickness that oscillation in a fundamental transverse mode can be maintained even when the semiconductor laser device operates with high output power. That is, a difference in an equivalent refractive index between a portion of the active region under the second stripe groove and another portion of the active region which is not located under the second stripe groove is in a range from $1.5\times 10^{-3}$ to $7\times 10^{-3}$.

In addition, the n-type $Al_{z1}Ga_{1-z1}As$ lower cladding layer 22, the p-type $Al_{z1}Ga_{1-z1}As$ first upper cladding layer 32, and the p-type $Al_{z1}Ga_{1-z1}As$ second upper cladding layer 37 have such a composition as to have a greater bandgap than the n-type or i-type $In_{x2}Ga_{1-x2}As_{1-y2}P_{y2}$ first lower optical waveguide layer 23, the $In_{x2}Ga_{1-x2}As_{1-y2}P_{y2}$ first upper optical waveguide layer 29, and the p-type or i-type $In_{x2}Ga_{1-x2}As_{1-y2}P_{y2}$ second upper optical waveguide layer 31 have. For example, the n-type $Al_{z1}Ga_{1-z1}As$ lower cladding layer 22, the p-type $Al_{z1}Ga_{1-z1}As$ first upper cladding layer 32, and the p-type $Al_{z1}Ga_{1-z1}As$ second upper cladding layer 37 may be made of an InGaP, InGaAlP, or InGaAlAsP material which lattice-matches with the GaAs substrate 21.

As illustrated in FIGS. 3B and 3C, in the near-edge portions (i.e., portions in vicinities of the end facets) of the layered structure, the thickness from the upper surface of the $In_{0.49}Ga_{0.51}P$ cap layer 30 to the bottom of the i-type $In_{x2}Ga_{1-x2}As_{1-y2}P_{y2}$ second lower optical waveguide layer 25 is removed, and the spaces produced by the removal are filled with the p-type or i-type $In_{x2}Ga_{1-x2}As_{1-y2}P_{y2}$ second upper optical waveguide layer 31.

In the construction of the semiconductor laser device as the third embodiment of the present invention, the compressive strain quantum well active layer may include more than one quantum well.

The absolute value of the sum of the product of the strain and the thickness of the compressive strain quantum well active layer and the product of the strain and the total thickness of the tensile strain barrier layers is equal to or smaller than 0.25 nm.

The semiconductor laser device as the third embodiment of the present invention can emit laser light with high output power while maintaining the oscillation in a single transverse mode.

Although the semiconductor laser device as the third embodiment is designed for oscillation in a single transverse mode, the above process used for production of the semiconductor laser device as the third embodiment can also be applied to broad-stripe index-guided semiconductor laser devices each of which oscillates in multiple modes.

Fourth Embodiment

Figure 4A:
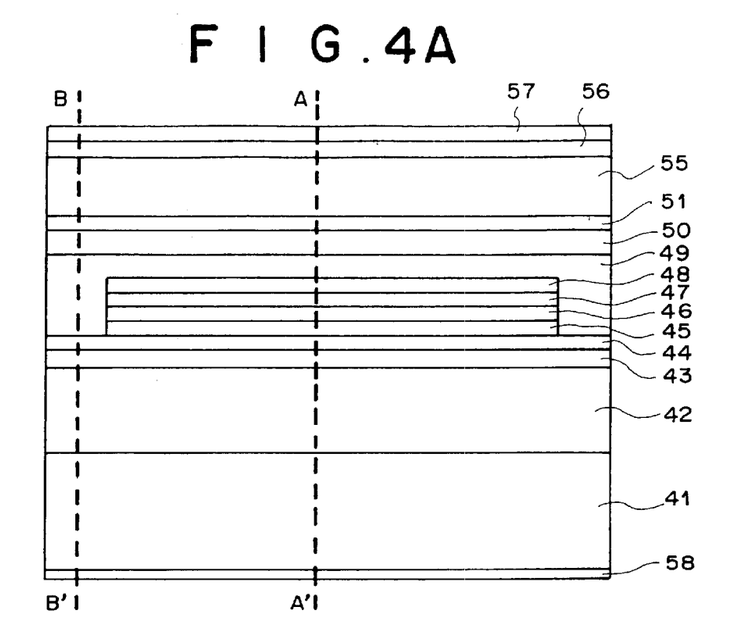
FIGS. 4A to 4C are cross-sectional views of a semiconductor laser device as a fourth embodiment of the present invention.
Figure 4B:
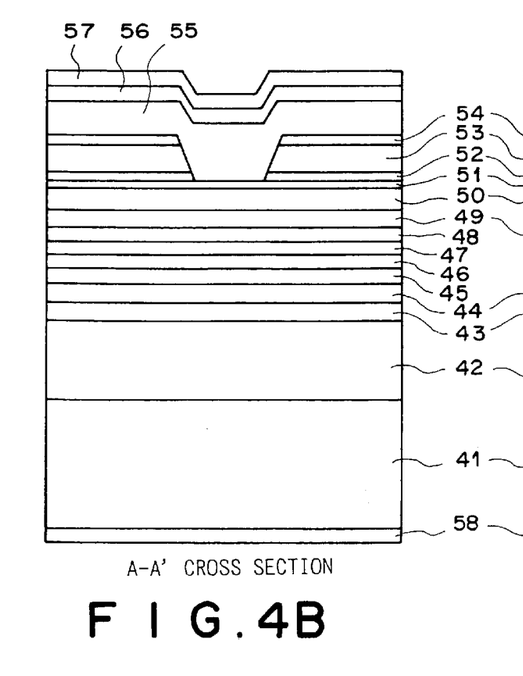
Figure 4C:
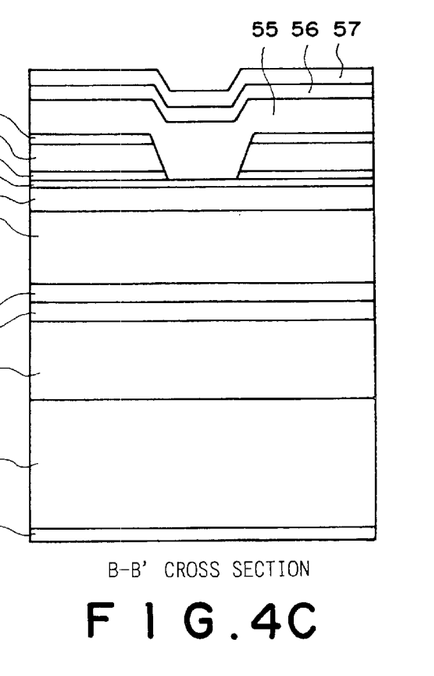

A process for producing a semiconductor laser device as the fourth embodiment of the present invention is explained below. FIGS. 4A to 4C are cross-sectional views of a semiconductor laser device as the fourth embodiment of the present invention. FIG. 4A shows a cross section parallel to the direction of light emitted from the semiconductor laser device, and FIGS. 4B and 4C respectively show the A–A' and B–B' cross sections indicated in FIG. 4A. Although, in practice, a plurality of semiconductor laser devices are concurrently manufactured on a semiconductor wafer of a substrate, and arranged side by side, a construction corresponding to only one semiconductor laser device is indicated in each of FIGS. 4A to 4C for the sake of simplicity of illustration and better understanding.

First, as illustrated in FIG. 4A, an n-type $Al_{z1}Ga_{1-z1}As$ lower cladding layer 42 ($0.2 \leq z1 \leq 0.8$), an n-type or i-type (intrinsic) $In_{x2}Ga_{1-x2}As_{1-y2}P_{y2}$ first lower optical waveguide layer 43 ($0 \leq x2 \leq 0.3$, x2=0.49y2), an i-type $In_{0.49}Ga_{0.51}P$ lower etching stop layer 44 having a thickness of about 5 nm, an i-type $In_{x2}Ga_{1-x2}As_{1-y2}P_{y2}$ second lower optical waveguide layer 45 having a thickness of about 10 nm, an $In_{x1}Ga_{1-x1}As_{1-y1}P_{y1}$ compressive strain quantum well active layer 46 ($0<x1 \leq 0.4$, $0 \leq y1 \leq 0.1$), a p-type or i-type $In_{x2}Ga_{1-x2}As_{1-y2}P_{y2}$ first upper optical waveguide layer 47 having a thickness of about 10 nm, and an $In_{0.49}Ga_{0.51}P$ cap layer 48 having a thickness of about 5 nm are formed on an n-type GaAs substrate 41 (in the form of a semiconductor wafer) by organometallic vapor phase epitaxy.

Next, a resist is applied to the $In_{0.49}Ga_{0.51}P$ cap layer 48, and predetermined stripe regions of the resist each having a width of about 40 micrometers and extending in the <0$\bar{1}$1> direction are removed by conventional lithography, where the locations of the stripe regions are determined so that the center of each of the stripe regions correspond to resonator surfaces of the plurality of semiconductor laser devices produced from the semiconductor wafer.

Thereafter, the $In_{0.49}Ga_{0.51}P$ cap layer 48 is etched with a hydrochloric acid etchant by using the remaining portions of the resist as a mask so that stripe areas of the $In_{x2}Ga_{1-x2}As_{1-y2}P_{y2}$ first upper optical waveguide layer 47 are exposed (i.e., first stripe grooves are formed). At this time, the etching with the hydrochloric acid etchant automatically stops at the upper surface of the $In_{x2}Ga_{1-x2}As_{1-y2}P_{y2}$ first upper optical waveguide layer 47. Then, the remaining portions of the resist are removed, and the layered structure is etched with a sulfuric acid etchant until stripe areas of the $In_{0.49}Ga_{0.51}P$ lower etching stop layer 44 are exposed. At this time, the etching with the sulfuric acid etchant automatically stops at the upper surface of the $In_{0.49}Ga_{0.51}P$ lower etching stop layer 44.

Next, a p-type or i-type $In_{x2}Ga_{1-x2}As_{1-y2}P_{y2}$ second upper optical waveguide layer 49, a p-type $Al_{z1}Ga_{1-z1}As$ first upper cladding layer 50, and a p-type $In_{0.49}Ga_{0.51}P$ first upper etching stop layer 51 having a thickness of about 10 nm are formed. Subsequently, as illustrated in FIG. 4B, a p-type GaAs second upper etching stop layer 52 having a thickness of about 10 nm, an n-type $In_{0.49}Ga_{0.51}P$ current confinement layer 53, and a GaAs cap layer 54 are formed.

Thereafter, a resist is applied to the GaAs cap layer 54, and predetermined stripe regions of the resist each having a width of about 1 to 3 micrometers and extending in the <011> direction (i.e., perpendicular to the above first stripe grooves) are removed. Then, the GaAs cap layer 54 is etched with a sulfuric acid etchant by using the remaining portions of the resist as a mask so that stripe areas of the n-type $In_{0.49}Ga_{0.51}P$ current confinement layer 53 are exposed. At this time, the etching with the sulfuric acid etchant automatically stops at the upper surface of the n-type $In_{0.49}Ga_{0.51}P$ current confinement layer 53. Subsequently, the remaining portions of the resist are removed, and the stripe areas of the n-type $In_{0.49}Ga_{0.51}P$ current confinement layer 53 are removed by etching with a hydrochloric acid etchant. Thus, second stripe grooves are formed.

Next, a p-type $Al_{z1}Ga_{1-z1}As$ second upper cladding layer 55 and a p-type GaAs contact layer 56 are formed. Then, a p electrode 57 is formed over the p-type GaAs contact layer 56, the exposed (opposite) surface of the substrate 41 is polished, and an n electrode 58 is formed on the polished surface of the substrate 41.

After the above layered structure is formed on the semiconductor wafer, the semiconductor wafer with the layered structure is cleaved at the positions of the end facets into laser array bars. Then, high-reflection coating and low-reflection coating are laid on the end facets of the laser array bars. Thereafter, the laser array bars are further cleaved into chips. Thus, the semiconductor laser device as the fourth embodiment of the present invention is obtained.

In the above construction, the p-type $Al_{z1}Ga_{1-z1}As$ first upper cladding layer 50 is arranged to have such a composition and a thickness that oscillation in a fundamental transverse mode can be maintained even when the semiconductor laser device operates with high output power. That is, a difference in an equivalent refractive index between a portion of the active region under the second stripe groove and another portion of the active region which is not located under the second stripe groove is in a range from $1.5 \times 10^{-3}$ to $7 \times 10^{-3}$.

In addition, the n-type $Al_{z1}Ga_{1-z1}As$ lower cladding layer 42, the p-type $Al_{z1}Ga_{1-z1}As$ first upper cladding layer 50, and the p-type $Al_{z1}Ga_{1-z1}As$ second upper cladding layer 55 have such a composition as to have a greater bandgap than the n-type or i-type $In_{x2}Ga_{1-x2}As_{1-y2}P_{y2}$ first lower optical waveguide layer 43, the $In_{x2}Ga_{1-x2}As_{1-y2}P_{y2}$ first upper optical waveguide layer 47, and the p-type or i-type $In_{x2}Ga_{1-x2}As_{1-y2}P_{y2}$ second upper optical waveguide layer 49 have. For example, the n-type $Al_{z1}Ga_{1-z1}As$ lower cladding layer 42, the p-type $Al_{z1}Ga_{1-z1}As$ first upper cladding layer 50, and the p-type $Al_{z1}Ga_{1-z1}As$ second upper cladding layer 55 may be made of an InGaAlP or InGaAlAsP material which lattice-matches with the GaAs substrate 41.

As illustrated in FIGS. 4B and 4C, in the near-edge portions (i.e., portions in vicinities of the end facets) of the layered structure, the thickness from the upper surface of the $In_{0.49}Ga_{0.51}P$ cap layer 48 to the bottom of the i-type $In_{x2}Ga_{1-x2}As_{1-y2}P_{y2}$ second lower optical waveguide layer 45 is removed, and the spaces produced by the removal are filled with the p-type or i-type $In_{x2}Ga_{1-x2}As_{1-y2}P_{y2}$ second upper optical waveguide layer 49.

Fifth Embodiment

Figure 5A:
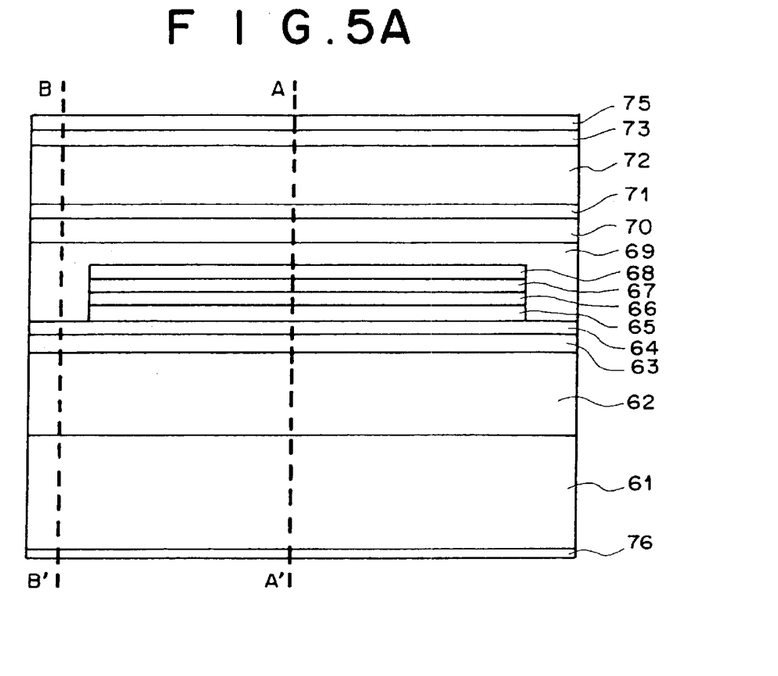
FIGS. 5A to 5C are cross-sectional views of a semiconductor laser device as a fifth embodiment of the present invention.
Figures 5B, 5C:
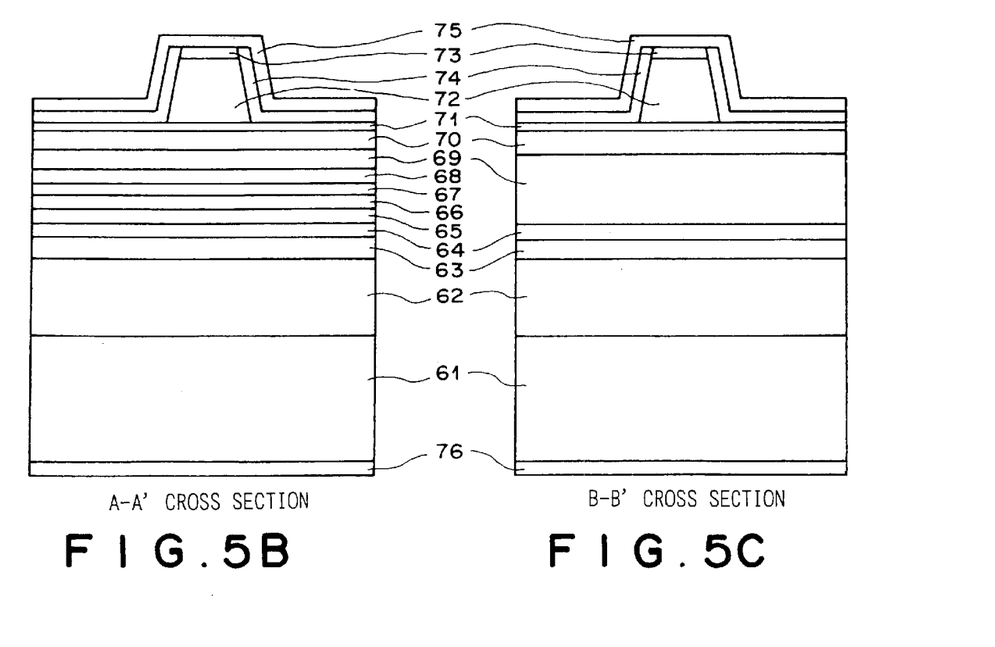

A process for producing a semiconductor laser device as the fifth embodiment of the present invention is explained below. FIGS. 5A to 5C are cross-sectional views of a semiconductor laser device as the fifth embodiment of the present invention. FIG. 5A shows a cross section parallel to the direction of light emitted from the semiconductor laser device, and FIGS. 5B and 5C respectively show the A–A' and B–B' cross sections indicated in FIG. 5A. Although, in practice, a plurality of semiconductor laser devices are concurrently manufactured on a semiconductor wafer of a substrate, and arranged side by side, a construction corresponding to only one semiconductor laser device is indicated in each of FIGS. 5A to 5C for the sake of simplicity of illustration and better understanding.

First, as illustrated in FIG. 5A, an n-type $Al_{z1}Ga_{1-z1}As$ lower cladding layer 62, an n-type or i-type (intrinsic) $In_{x2}Ga_{1-x2}As_{1-y2}P_{y2}$ first lower optical waveguide layer 63 ($0 \leq x2 \leq 0.3$, x2=0.49y2), an i-type $In_{0.49}Ga_{0.51}P$ lower etching stop layer 64 having a thickness of about 5 nm, an i-type $In_{x2}Ga_{1-x2}As_{1-y2}P_{y2}$ second lower optical waveguide layer 65 having a thickness of about 10 nm, an $In_{x1}Ga_{1-x1}As_{1-y1}P_{y1}$ compressive strain quantum well active layer 66 ($0<x1\leq0.4$, $0\leq y1\leq0.1$), a p-type or i-type $In_{x2}Ga_{1-x2}As_{1-y2}P_{y2}$ first upper optical waveguide layer 67 having a thickness of about 10 nm, and an $In_{0.49}Ga_{0.51}P$ cap layer 68 having a thickness of about 5 nm are formed on an n-type GaAs substrate 61 (in the form of a semiconductor wafer) by organometallic vapor phase epitaxy.

Next, a resist is applied to the $In_{0.49}Ga_{0.51}P$ cap layer 68, and predetermined stripe regions of the resist each having a width of about 40 micrometers and extending in the <0$\bar{1}$1> direction are removed by conventional lithography, where the locations of the stripe regions are determined so that the center of each of the stripe regions correspond to resonator surfaces of the plurality of semiconductor laser devices produced from the semiconductor wafer.

Thereafter, the $In_{0.49}Ga_{0.51}P$ cap layer 68 is etched with a hydrochloric acid etchant by using the remaining portions of the resist as a mask so that stripe areas of the $In_{x2}Ga_{1-x2}As_{1-y2}P_{y2}$ first upper optical waveguide layer 67 are exposed (i.e., first stripe grooves are formed). At this time, the etching with the hydrochloric acid etchant automatically stops at the upper surface of the $In_{x2}Ga_{1-x2}As_{1-y2}P_{y2}$ first upper optical waveguide layer 67. Then, the remaining portions of the resist are removed, and the layered structure is etched with a sulfuric acid etchant until stripe areas of the $In_{0.49}Ga_{0.51}P$ lower etching stop layer 64 are exposed. At this time, the etching with the sulfuric acid etchant automatically stops at the upper surface of the $In_{0.49}Ga_{0.51}P$ lower etching stop layer 64.

Next, a p-type or i-type $In_{x2}Ga_{1-x2}As_{1-y}P_{y2}$ second upper optical waveguide layer 69, a p-type $Al_{z1}Ga_{1-z1}As$ first upper cladding layer 70, a p-type $In_{0.49}Ga_{0.51}P$ upper etching stop layer 71 having a thickness of about 10 nm, a p-type $Al_{z1}Ga_{1-z1}As$ second upper cladding layer 72, and a p-type GaAs contact layer 73 are formed.

Thereafter, an insulation film is formed on the GaAs contact layer 73, and the insulation film except for predetermined stripe regions each having a width of about 1 to 3 micrometers and extending in the <011> direction (i.e., perpendicular to the above first stripe grooves) is removed. Then, the GaAs contact layer 73 and the p-type $Al_{z1}Ga_{1-z1}As$ second upper cladding layer 72 are etched with a sulfuric acid etchant by using the remaining portions of the insulation film as a mask so that a ridge is formed. Subsequently, another insulation film 74 is formed over the layered structure formed as above, and the insulation films on the top of the ridge are removed by conventional lithography. Next, a p electrode 75 is formed over the layered structure formed above, the exposed (opposite) surface of the substrate 61 is polished, and an n electrode 76 is formed on the polished surface of the substrate 61.

After the above layered structure is formed on the semiconductor wafer, the semiconductor wafer with the layered structure is cleaved at the positions of the end facets into laser array bars. Then, high-reflection coating and low-reflection coating are laid on the end facets of the laser array bars. Thereafter, the laser array bars are further cleaved into chips. Thus, the semiconductor laser device as the fifth embodiment of the present invention is obtained.

In the above construction, the p-type $Al_{z1}Ga_{1-z1}As$ first upper cladding layer 70 is arranged to have such a thickness that oscillation in a fundamental transverse mode can be maintained even when the semiconductor laser device operates with high output power. That is, a difference in an equivalent refractive index between a portion of the active region under the ridge and another portion of the active region which is not located under the ridge is in a range from $1.5\times10^{-3}$ to $7\times10^{-3}$.

As illustrated in FIGS. 5B and 5C, in the near-edge portions (i.e., portions in vicinities of the end facets) of the layered structure, the thickness from the upper surface of the $In_{0.49}Ga_{0.51}P$ cap layer 68 to the bottom of the i-type $In_{x2}Ga_{1-x2}As_{1-y2}P_{y2}$ second lower optical waveguide layer 65 is removed, and the spaces produced by the removal are filled with the p-type or i-type $In_{x2}Ga_{1-x2}As_{1-y2}P_{y2}$ second upper optical waveguide layer 69.

VARIATIONS AND OTHER MATTERS (i) Since the active layers in the semiconductor laser devices as the first to fifth embodiments of the present invention have a composition of $In_{x1}Ga_{1-x1}As_{1-y1}P_{y1}$ ($0<x1\leq0.4$, $0\leq y1\leq0.1$), the oscillation wavelengths of the semiconductor laser devices as the first to fifth embodiments of the present invention can be controlled in the range of 900 to 1,200 nm.

(ii) Each layer in the constructions of the first to fifth embodiments may be formed by molecular beam epitaxy using solid or gas raw material.

(iii) Although the n-type GaAs substrates are used in the construction of the first to fifth embodiments of the present invention, instead, p-type GaAs substrates may be used. When the GaAs substrate in the construction of each embodiment is a p-type, the conductivity types of all of the other layers in the construction should be inverted.

(iv) In the construction of each embodiment, the compressive strain quantum well active layer may include more than one quantum well.

(v) In the construction of each embodiment, the product of the strain and the thickness of the compressive strain quantum well active layer is equal to or smaller than 0.25 nm.

(vi) Since the semiconductor laser devices according to the present invention is reliable in a wide output power range from low to high output power, the semiconductor laser devices according to the present invention can be used as a light source in the fields of high-speed information and image processing, communications, laser measurement, medicine, printing, and the like.

Further, since the semiconductor laser devices according to the present invention is reliable in operation with high output power, the semiconductor laser devices according to the present invention can be used as a light source for exciting a solid-state laser element or a wavelength conversion element.

What is claimed is:

1. A semiconductor laser device comprising:
   a GaAs substrate of a first conductive type;
   a lower cladding layer of said first conductive type, formed on said GaAs substrate;
   a first lower optical waveguide layer made of $In_{x2}Ga_{1-x2}As_{1-y2}P_{y2}$ having a first bandgap, and formed on said lower cladding layer, where $0\leq x2\leq0.3$ and $x2=0.49y2$;
   an intermediate layer made of $In_{x5}Ga_{1-x5}P$ and formed on said first lower optical waveguide layer, where $0<x5<1$;
   a second lower optical waveguide layer made of $In_{x2}Ga_{1-x2}As_{1-y2}P_{y2}$ having said first bandgap, and formed on said intermediate layer except for near-edge areas of said first intermediate layer located in first vicinities of opposite end facets of said semiconductor laser device so as to leave first portions of spaces in the first vicinities of opposite end facets, where $0 \leq x2 \leq 0.3$ and $x2=0.49y2$;

a compressive strain active layer made of $In_{x1}Ga_{1-x1}As_{1-y1}P_{y1}$ having a second bandgap smaller than said first bandgap, and formed on said second lower optical waveguide layer so as to leave second portions of said spaces in second vicinities of opposite end facets, where $0<x1 \leq 0.4$ and $0 \leq y1 \leq 0.1$;

an upper optical waveguide layer made of $In_{x2}Ga_{1-x2}As_{1-y2}P_{y2}$ having said first bandgap, and formed on said compressive strain active layer so as to leave third portions of said spaces in third vicinities of opposite end facets, where $0 \leq x2 \leq 0.3$ and $x2=0.49y2$;

a cap layer made of $In_{x5}Ga_{1-x5}P$ and formed on said upper optical waveguide layer so as to leave fourth portions of said spaces in fourth vicinities of opposite end facets, where $0<x5<1$;

a non-absorbent layer made of $In_{x6}Ga_{1-x6}As_{1-y6}P_{y6}$ having a third bandgap greater than said second bandgap, and formed over said cap layer so that said spaces are filled with the non-absorbent layer, where $0 \leq x6 \leq 0.3$ and $x6=0.49y6$;

an upper cladding layer of a second conductive type, formed on said non-absorbent layer; and a contact layer of said second conductive type, formed on said upper cladding layer.

2. A semiconductor laser device according to claim 1, wherein said contact layer is formed on said upper cladding layer except for near-edge areas of said upper cladding layer located in fifth vicinities of said end facets of said semiconductor laser device, and an insulation layer is formed on said near-edge areas of said upper cladding layer so as to prevent current injection through the near-edge areas of said upper cladding layer.

3. A semiconductor laser device according to claim 1, wherein each of said lower and upper cladding layers is made of one of $Al_{z1}Ga_{1-z1}As$ and $In_{x3}(Al_{z3}Ga_{1-z3})_{1-x3}As_{1-y3}P_{y3}$, where $0.2 \leq z1 \leq 0.8$, $x3=0.49y3$, $0.9<y3 \leq 1$, and $0 \leq z3 \leq 1$.

4. A semiconductor laser device according to claim 1, wherein regions of said semiconductor laser device above at least a mid-thickness of said upper cladding layer except for a stripe region of said semiconductor laser device are removed so as to form a ridge and realize index guidance of light.

5. A semiconductor laser device according to claim 1, further comprising a current confinement layer made of one of $Al_{z2}Ga_{1-x2}As$ and $In_{0.49}Ga_{0.51}P$ which lattice-match with GaAs, and formed above said upper optical waveguide layer so as to form an internal current confinement structure realizing index guidance of light, where $0.2<z2<1$.

6. A process for producing a semiconductor light emitting device, comprising the steps of:

(a) forming above a GaAs substrate of a first conductive type a lower cladding layer of the first conductive type;

(b) forming above said lower cladding layer a first lower optical waveguide layer made of $In_{x2}Ga_{1-x2}As_{1-y2}P_{y2}$, where $0 \leq x2 \leq 0.3$ and $x2=0.49y2$;

(c) forming above said first lower optical waveguide layer an intermediate layer made of $In_{x5}Ga_{1-x5}P$, where $0<x5<1$;

(d) forming above said intermediate layer a second lower optical waveguide layer made of $In_{x2}Ga_{1-x2}As_{1-y2}P_{y2}$, where $0 \leq x2 \leq 0.3$ and $x2=0.49y2$;

(e) forming above said second lower optical waveguide layer a compressive strain active layer made of $In_{x1}Ga_{1-x1}As_{1-y1}P_{y1}$, where $0<x1 \leq 0.4$ and $0 \leq y1 \leq 0.1$;

(f) forming above said compressive strain active layer a first upper optical waveguide layer made of $In_{x2}Ga_{1-x2}As_{1-y2}P_{y2}$, where $0 \leq x2 \leq 0.3$ and $x2=0.49y2$;

(g) forming above said first upper optical waveguide layer a first cap layer made of $In_{x5}Ga_{1-x5}P$, where $0<x5<1$;

(h) etching off near-edge portions of said first cap layer located in first vicinities of two opposite end facets of said semiconductor laser device with a hydrochloric acid etchant so as to produce first portions of spaces in the first vicinities of said two opposite end facets of said semiconductor laser device;

(i) etching off near-edge portions of said upper optical waveguide layer, said compressive strain active layer, and said second lower optical waveguide layer, located in second vicinities of said two opposite end facets of said semiconductor laser device, by using a sulfuric acid etchant and said first cap layer as a mask, so as to produce second portions of said spaces in second vicinities of two opposite end facets of said semiconductor laser device;

(j) forming a second upper optical waveguide layer made of $In_{x2}Ga_{1-x2}As_{1-y2}P_{y2}$ over said first cap layer so that said spaces are filed with the second upper optical waveguide layer, where $0 \leq x2 \leq 0.3$ and $x2=0.49y2$;

(k) forming an upper cladding layer of a second conductive type over said second upper optical waveguide layer; and (l) forming a GaAs contact layer of said second conductive type above said upper cladding layer.

7. A process according to claim 6, further comprising, between said steps (g) and (h), the steps of:

(m) forming a second cap layer made of GaAs, on said first cap layer; and (n) etching off near-edge portions of said second cap layer located in third vicinities of said two opposite end facets of said semiconductor laser device by using a sulfuric acid etchant so as to produce additional portions of said spaces;

in said step (h), said second cap layer is used as a mask; and in said step (i), said second cap layer is etched off concurrently with said near-edge portions of said upper optical waveguide layer, said compressive strain active layer, and said second lower optical waveguide layer.

* * * * *